United States Patent
Ahn

(10) Patent No.: US 6,424,568 B2
(45) Date of Patent: Jul. 23, 2002

(54) CODE ADDRESSABLE MEMORY CELL IN FLASH MEMORY DEVICE

(75) Inventor: Byung-Jin Ahn, Ichon (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/748,266

(22) Filed: Dec. 27, 2000

(30) Foreign Application Priority Data

Dec. 28, 1999 (KR) .............................................. 99-63890

(51) Int. Cl.⁷ .................................................. G11C 7/00
(52) U.S. Cl. ........................... 365/185.08; 365/185.05; 365/185.26; 365/149; 365/185.01
(58) Field of Search ....................... 365/185.01, 185.05, 365/185.08, 149, 185.26

(56) References Cited

U.S. PATENT DOCUMENTS

| 5,243,575 A | 9/1993 | Sambandan et al. ..... 365/233.5 |
| 5,485,595 A | 1/1996 | Assar et al. ................. 395/430 |
| 5,917,743 A | 6/1999 | Roy ............................. 365/49 |
| 6,002,614 A | 12/1999 | Banks .................... 365/189.01 |
| 6,005,790 A | 12/1999 | Chan et al. .................... 365/49 |
| 6,044,017 A | * 3/2000 | Lee et al. .............. 365/185.18 |
| 6,125,055 A | 9/2000 | Kasa et al. ............ 365/185.04 |

FOREIGN PATENT DOCUMENTS

| JP | 407030002 A | * 1/1995 |
| JP | 02000150683 A | * 5/2000 |

* cited by examiner

*Primary Examiner*—Viet Q. Nguyen
(74) *Attorney, Agent, or Firm*—Finnegan, Henderson, Farabow, Garrett & Dunner, L.L.P.

(57) ABSTRACT

A code addressable memory (CAM) included in a flash memory device comprises a unit cell including a floating gate and a control gate; and a gate coupling unit coupled to the unit cell or further comprises a switching circuit for connecting and disconnecting the unit cell with the gate coupling unit respectively at a read operation of the CAM and a programming or an erasing operation of the CAM.

3 Claims, 4 Drawing Sheets

CODE ADDRESSABLE MEMORY CELL IN FLASH MEMORY DEVICE

Cross-Reference to Related Applications

Priority is claimed from Republic of Korea Patent Application No. 1999-63890 filed Dec. 28, 1999.

Field of the Invention

This invention relates to a flash memory device; and more particularly, to a code addressable memory (CAM) cell in a flash memory device.

DESCRIPTION OF THE PRIOR ART

A flash memory device is a nonvolatile memory device capable of electrically erasing and programming. The flash memory device performs protection/nonprotection of code information that needs to be protected during a use of a flash memory product and performs repair required to increase a yield in a progress of performing a product test.

FIG. 1A shows roughly a section of a conventional code addressable memory (CAM) cell of a flash memory device.

FIG. 1B is a circuit diagram equivalent to the conventional CAM cell shown in FIG. 1A.

As shown in FIG. 1A, a floating gate 12 and a control gate 13 are stacked on a semiconductor substrate 11 to thereby form a gate. Also, a source (S) and a drain (D) are formed on the semiconductor substrate 11. The conventional CAM cell has the same architecture as a main cell as shown in the drawing.

Generally, to read out information of a cell, it is required that a predetermined voltage is applied to the control gate and current quantity flowing into the drain is sensed. Mostly a power source voltage ($V_{cc}$) is directly used as the voltage applied to the control gate in order to reduce a time delay that it will take to perform the read operation in utilizing a boosting voltage internally in the flash memory device. However, in this case, there is caused a problem that the current quantity flowing into the drain is too small to sense.

That is to say, at a read operation of the CAM cell, a conductance of the cell ($G_m$) is dropped by a coupling ratio about 0.55 that is generated at a dielectric layer between the floating gate 12 and the control gate 13. Also, in a threshold voltage ($V_T$) of 2.0 V, as an operation voltage gets lower, which operates the memory device and is used as a control gate voltage, the cell current quantity is suddenly decreased. Accordingly, it is difficult to read out cell information and thus, it is unavoidable to get a cell threshold voltage lower than 0V in order to perform data sensing by erasing the cell excessively.

However, erasing the cell excessively caused a problem that data is not easy to keep in store for long time, due to a leakage current of the cell under lots of disadvantageous environments where high temperature, high voltage or the like are generated.

Also, the flash memory device needs to be capable of keeping data in store for about 10 years and it is required to form a tunnel oxide layer and an inter-layer insulating layer thickly in order to satisfy the capability. At this point, it is not easy to perform a vertical shrink of the cell in a high-integrated device. Accordingly, since a limitation of data storage capability of the cell keeps the tunnel oxide layer and the inter-layer insulating layer from being formed thin, the cell current quantity can't be increased to thereby be difficult to read out Information of the main cell.

Therefore, it is general to read out the cell information by raising the cell gate voltage using a word line boosting circuit.

However, adding the boosting circuit in the flash memory device causes space for a neighboring circuit to become wider and also, there is a problem that a performance of the device is dropped since it takes an undesired latency time to read out the data stored in the CAM cell.

SUMMARY OF THE INVENTION

It is an object of the present invention to provide a code addressable memory (CAM) cell included in a flash memory device that can be operated stably at a low voltage by increasing a coupling rate of the CAM cell In accordance with an aspect of the present invention, there is provided a code addressable memory (CAM) included in a flash memory device comprising a unit cell including a floating gate and a control gate; and a gate coupling unit coupled to the unit cell or further comprising a switching circuit for connecting and disconnecting the unit cell with the gate coupling unit respectively at a read operation of the CAM and a programming or an erasing operation of the CAM.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1A:
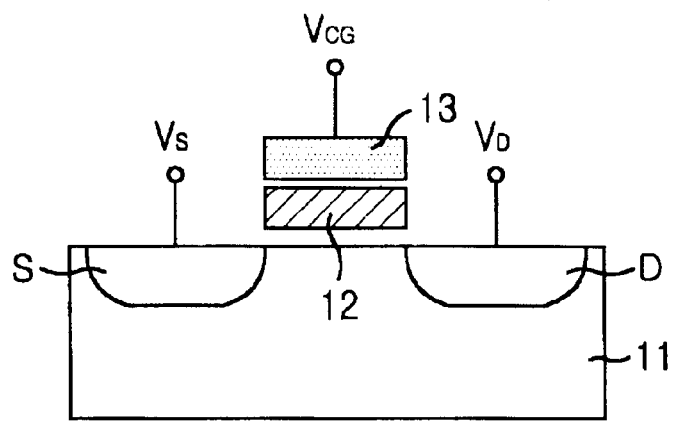
FIG. 1A shows roughly a section of a conventional code addressable memory (CAM) cell of a flash memory device.
Figure 1B:
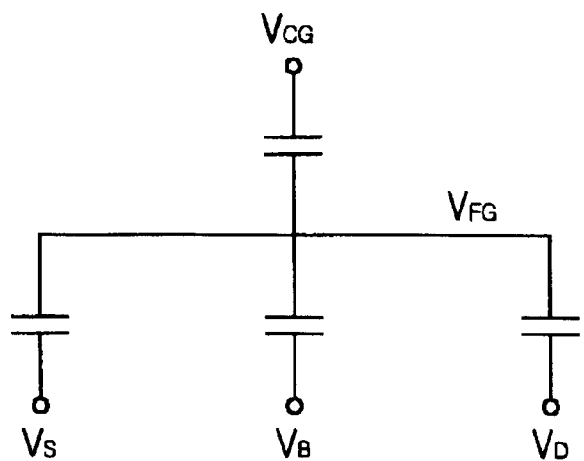
FIG. 1B is a circuit diagram equivalent to the conventional CAM cell shown in FIG. 1A.
Figure 2A:
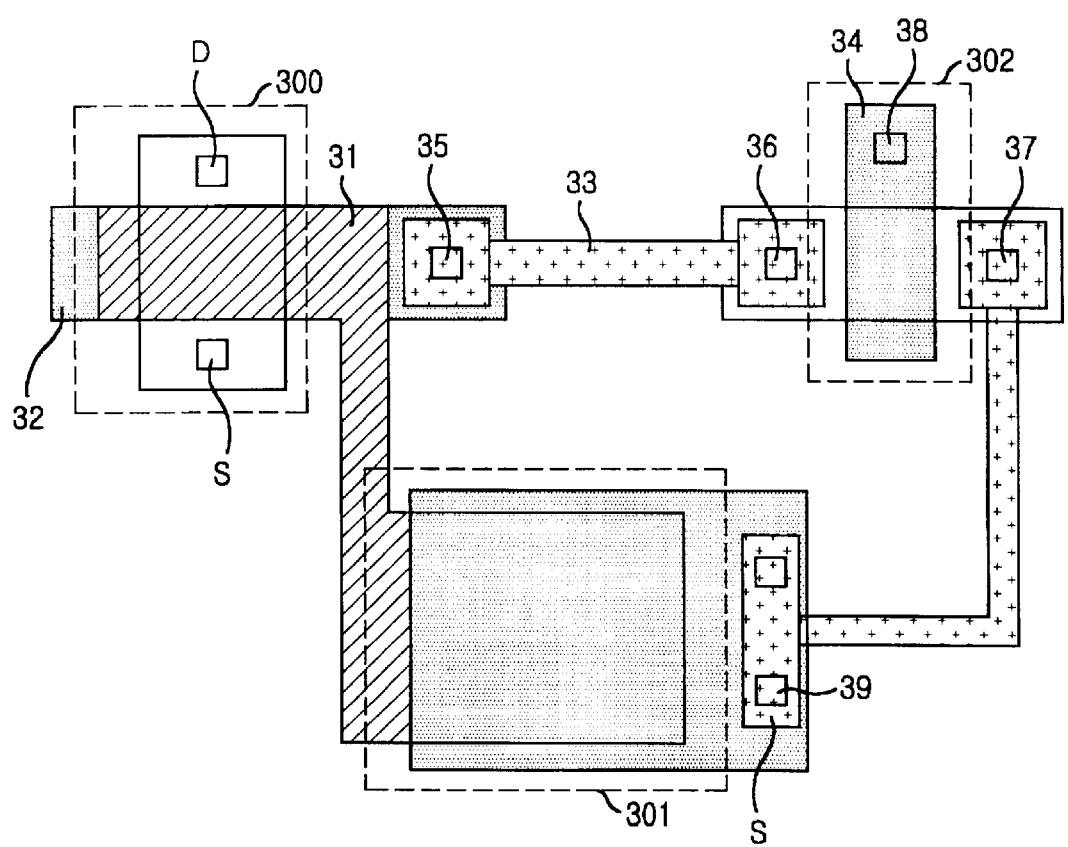
FIG. 2A shows a layout of a flash memory device in accordance with a first embodiment of the present invention.

FIG. 2A shows a layout of a flash memory device in accordance with a first embodiment of the present invention.

Architecture of a code addressable memory (CAM) cell is same as that of a general unit cell 300. However, since data can't be read out correctly at a low voltage from the CAM cell of this architecture, a gate coupling unit including a stack capacitor 301 is added in the CAM cell to thereby increase overall gate coupling ratio of the CAM cell.

As shown in FIG. 2A, a unit cell 300 includes a floating gate 31, a control gate 32, a soured terminal (S) and a drain terminal (D). A gate coupling unit is formed of the stack capacitor 301 so that the floating gate 31 and the control gate 32 of the unit cell 300 can be coupled each other. In other words, an upper electrode and a lower electrode of the stack capacitor 301 are respectively connected to the floating gate 31 and the control gate 32 of the unit cell 300.

A transmission gate 302 is placed between the unit cell 300 and the stack capacitor 301, wherein the transmission gate 302 is operated as a switching circuit. The transmission gate 302 is coupled with the unit cell 300 by coupling a cell control gate contact 35 and a transmission gate first contact 36, between which a metal line 33 is placed and to which a cell gate voltage ($V_{CG}$) is applied. Also, the transmission gate 302 is coupled with the stack capacitor 301 by coupling a stack gate contact 39 and a transmission gate second contact 37, between which the metal line 33 is placed.

The floating gate 31 connects the stack capacitor 301 with the unit cell 300. A reference numeral 38 denotes a transmission gate third contact that is used as an input terminal of the transmission gate 302.

At a read operation of the CAM cell, the transmission gate 302 is turned on to connect the unit cell 300 and the stack capacitor 301 electrically, so that a coupling rate of the overall CAM cell is increased as much as a coupling rate that is generated at the stack capacitor 301.

On the other hand, at a program and erase operation of the CAM cell, the transmission gate 302 is turned off to disconnect the unit cell 300 and the stack capacitor 301 electrically.

Figure 2B:
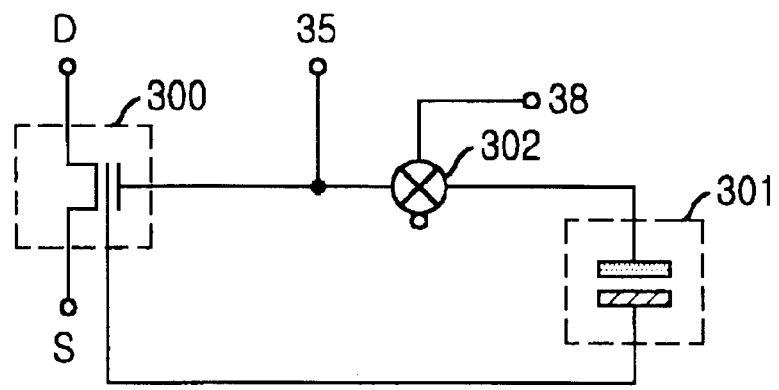
FIG. 2B is a circuit diagram equivalent to the layout shown in FIG. 2A.

FIG. 2B is a circuit diagram equivalent to the layout shown in FIG. 2A.

Figure 3:
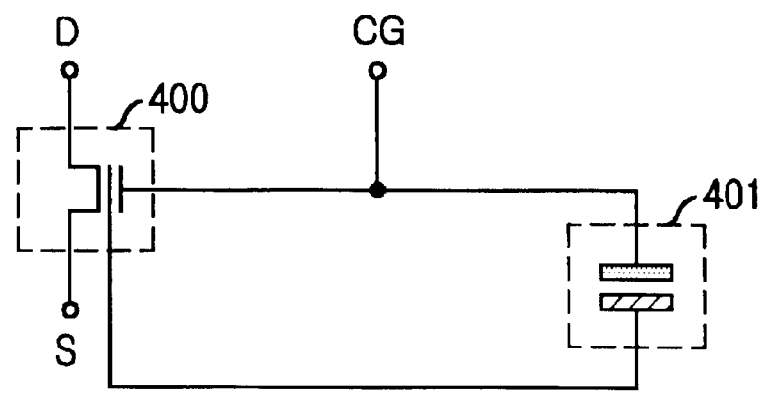
FIG. 3 is a circuit diagram equivalent to a flash memory device in accordance with a second embodiment of the present invention.

FIG. 3 is a circuit diagram equivalent to a flash memory device in accordance with a second embodiment of the present invention.

As shown in FIG. 3, a unit cell 400 is directly connected with a stack capacitor 401 without placing a transmission gate between the unit cell and the stack capacitor. Since a coupling rate of overall CAM cell is increased by the stack capacitor 401, an erase and a read operations of the CAM cell is easy to perform.

In architecture of the CAM cell in accordance with the present invention, the CAM cell has a high coupling rate at the erase operation because the CAM cell includes not only a unit cell but also an additional gate coupling unit which is formed of the stack capacitor. Accordingly, it is easy to perform a data sensing since a higher current can be generated at a designated threshold voltage for the erase.

Figure 4:
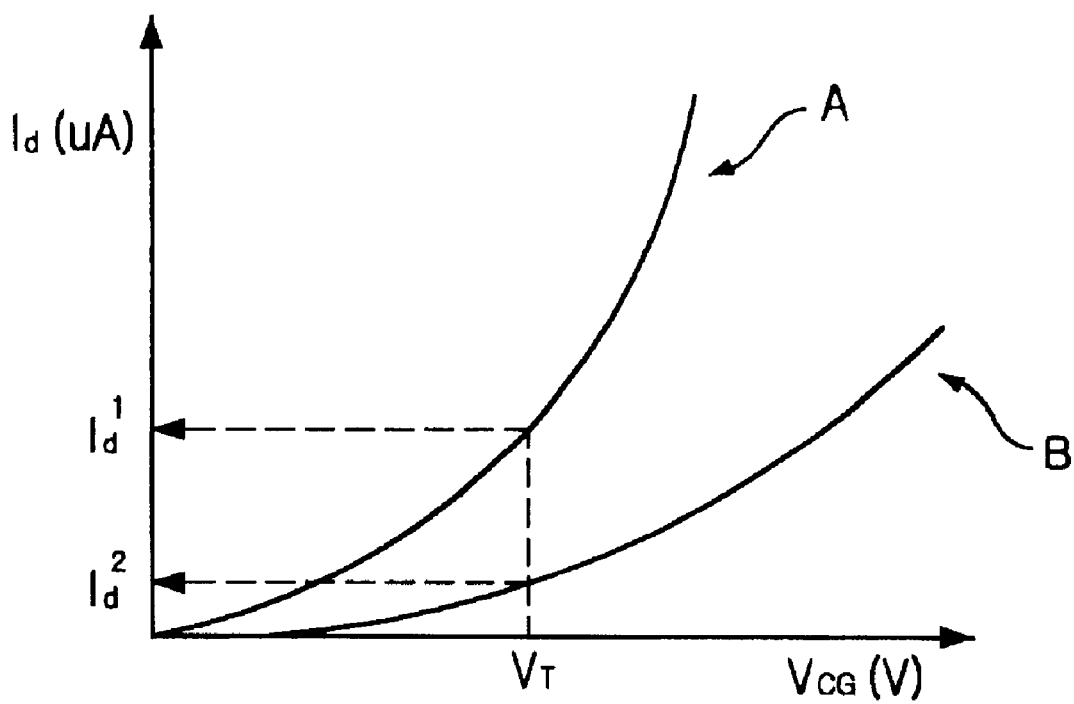
FIG. 4 is a graph illustrating voltage-current characteristics of each flash memory cell respectively in accordance with the present invention and the conventional invention.

FIG. 4 is a graph illustrating voltage-current characteristics of each flash memory cell respectively in accordance with the present invention and the conventional invention.

As shown in the graph, a curve A shows a voltage-current characteristic of a flash memory cell in accordance with the present invention and a curve B shows a voltage-current characteristic of a flash memory cell in accordance with the conventional invention.

A cell current at a predetermined control gate voltage ($V_{CG}$), for example at a $V_T$, is increasing more in the flash memory cell of the present invention than the conventional invention, because the gate coupling rate is higher in the curve A than the curve B.

In accordance with the present invention, it is easier to perform a read operation since a cell current can be increased as the coupling rate of the CAM cell is increased. Accordingly, reliability of the CAM cell will be improved because it is avoidable for a characteristic of a charge retention due to an excessive erase of the CAM cell to make worse.

Also, there is another advantageous effect that an erase speed of the CAM cell can be higher to thereby operate the CAM cell stably.

Although the preferred embodiments of the invention have been disclosed for illustrative purpose, those skilled in the art will appreciate that various modifications, additions, and substitutions are possible, without departing from the scope and sprit of the invention as disclosed in the accompanying claims.

What is claimed is:

1. A code addressable memory for use in a flash memory device, the code addressable memory comprising:
   a unit cell having a floating gate and a control gate; and
   a capacitor including an upper electrode and a lower electrode, wherein the upper electrode is coupled to the control gate and the lower electrode is coupled to the floating gate.

2. The code addressable memory as recited in claim 1, further comprising a switching circuit for electrically coupling and decoupling the unit cell and the capacitor.

3. The code addressable memory as recited in claim 2, wherein the switching circuit comprises circuitry for electrically coupling between the unit cell and the capacitor during a read operation of the code addressable memory and decoupling the unit cell and the capacitor during a programming or an erasing operation of the code addressable memory.

* * * * *